US006678381B1

(12) United States Patent
Manabe

(10) Patent No.: US 6,678,381 B1
(45) Date of Patent: Jan. 13, 2004

(54) ULTRA-DIRECTIONAL SPEAKER

(75) Inventor: Koji Manabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/197,675

(22) Filed: Nov. 23, 1998

(30) Foreign Application Priority Data

Nov. 25, 1997 (JP) ........................................... 9-322547

(51) Int. Cl.[7] ........................... H04B 3/00; H03G 5/00; H04R 25/00

(52) U.S. Cl. ........................... 381/77; 381/98; 381/182

(58) Field of Search .............................. 381/77–79, 82, 381/160, 182, 98–99

(56) References Cited

U.S. PATENT DOCUMENTS

| | | | | | |
|---|---|---|---|---|---|
| 4,823,908 | A | * | 4/1989 | Tanaka et al. | 381/160 |
| 5,159,703 | A | * | 10/1992 | Lowery | 455/42 |
| 5,412,734 | A | * | 5/1995 | Thomasson | 381/83 |
| 5,859,915 | A | * | 1/1999 | Norris | 381/82 |
| 6,052,336 | A | * | 4/2000 | Lowery, III | 367/139 |
| 6,229,899 | B1 | * | 5/2001 | Norris et al. | 381/77 |

FOREIGN PATENT DOCUMENTS

| | | |
|---|---|---|
| JP | 60-21695 | 2/1985 |
| JP | 61-264995 | 11/1986 |
| JP | 62-296698 | 12/1987 |
| JP | 3-15900 | 1/1991 |
| JP | 3-159400 | 7/1991 |
| JP | 3-296399 | 12/1991 |
| JP | 4-20799 | 2/1992 |
| JP | 4-74097 | 3/1992 |
| JP | 4-207400 | 7/1992 |
| JP | 4-215399 | 8/1992 |
| JP | 7-322395 | 12/1995 |

* cited by examiner

*Primary Examiner*—Minsun Oh Harvey
*Assistant Examiner*—Laura A. Grier
(74) *Attorney, Agent, or Firm*—Whitham, Curtis & Christofferson, PC

(57) ABSTRACT

The ultra-directional speaker of the present invention comprises: an audio generator for generating an audio signal; an ultrasonic generator for generating an ultrasonic signal; a frequency modulator for frequency modulating the ultrasonic signal with the audio signal to produce a frequency modulated ultrasonic signal; and an electro-acoustic transducer for transducing the frequency modulated ultrasonic signal into acoustic waves.

21 Claims, 2 Drawing Sheets

ULTRA-DIRECTIONAL SPEAKER

FIELD OF THE INVENTION

The present invention relates to an ultra-directional speaker and a method for driving the ultra-directional speaker, and in particular, to an ultra-directional speaker which can provide sound with high directionality and a high sound pressure using ultrasonic waves.

This application is based on Japanese Patent Application No. Hei 9-322547, the contents of which are incorporated herein by reference.

BACKGROUND ART

Various ultra-directional speakers using ultrasonic waves have been proposed. Japanese Patent Application, First Publication No. Hei 3-159400 discloses an ultra-directional speaker using a sound signal and an ultrasonic signal, in which the ultrasonic signal at a particular frequency, used as a carrier wave, is amplitude modulated with the sound signal and a resulting modulated signal is output as sound from an ultrasonic vibrator.

Japanese Patent Application, First Publication No. Hei 3-296399 discloses technique in which an ultrasonic signal is amplitude modulated with a sound signal, and a resulting modulated signal is output as sound from a number of ultrasonic vibrators in the speaker which is vibrated or rotated so as to propagate the sound to a listener in a specified position.

As shown in a block diagram of FIG. 4, such speaker employs an amplitude modulator 21 for amplitude modulating the high frequency signal with the sound signal. The amplitude modulator 21 performs modulation with the audio signal from an audio generator 11 and the high frequency signal from a high frequency signal generator 51, and an electro-acoustic transducer 41 emits acoustic waves.

However, there is a problem that a high sound pressure cannot be achieved because the acoustic waves from the electro-acoustic transducer has a low amplitude. When a high sound pressure is desired with the background art, the output must be increased and an amplification factor of an amplifier 31 must be increased, and this leads to a complicated structure and increased cost.

SUMMARY OF THE INVENTION

It is therefore an object of the present invention to provide an ultra-directional speaker which can provide sound with a higher sound pressure than that of the background art without increasing cost or drastically modifying the structure, and a method for driving the ultra-directional speaker.

In order to accomplish the above object, an ultra-directional speaker of the present invention comprises: an audio generator for generating an audio signal; an ultrasonic generator for generating an ultrasonic signal; a frequency modulator for frequency modulating the ultrasonic signal with the audio signal to produce a frequency modulated ultrasonic signal; and an electro-acoustic transducer for transducing the frequency modulated ultrasonic signal into acoustic waves.

The ultra-directional speaker may further comprise an amplifier for amplifying the frequency modulated ultrasonic signal, and the amplifier may be connected between the frequency modulator and the electro-acoustic transducer. Preferably, the ultrasonic generator generates the ultrasonic signal in a frequency range of 10 kHz to 1000 kHz. A plurality of the electro-acoustic transducers may be provided, and may receive different frequency modulated ultrasonic signals, respectively. The ultra-directional speaker may further comprise a reflection plate for reflecting ultrasonic waves and audible sound waves included in the acoustic waves from the electro-acoustic transducer, and preferably the reflection plate has a curved reflection surface to allow the sound waves to converge on a particular point. The ultra-directional speaker may further comprise a filter for selectively absorbing the ultrasonic waves.

In another aspect of the present invention, a method for driving a speaker which includes an electro-acoustic transducer for outputting ultra-directional acoustic waves from an audio signal using ultrasonic carrier waves, comprises the steps of: modulating the ultrasonic waves with the audio signal to produce a frequency modulated signal; and driving the electro-acoustic transducer with the frequency modulated signal. Preferably, the ultrasonic-waves have a frequency in a range of 10 kHz to 1000 kHz. A plurality of the electro-acoustic transducers may be driven by a single frequency modulator, or by a plurality of frequency modulators which are connected to a plurality of ultrasonic generators, respectively.

The acoustic waves from the electro-acoustic transducer include ultrasonic waves and an audible audio signal. Ultra-directional sound, which has low frequency components audible to a listener, is demodulated from the acoustic waves due to nonlinear interaction during propagating via air as ultrasonic waves.

According to the present invention, a higher sound pressure than that of the background art can be achieved, and sound characteristic and sound propagation characteristic can be improved because the electro-acoustic transducer exclusively transmits the frequency modulated signal in a specified frequency band so as to emit high amplitude sound waves.

DETAILED DESCRIPTION OF THE PREFERRED EMBODIMENTS

Referring to figures, a best mode of an ultra-directional speaker and a method for driving the speaker, according to an embodiment of the present invention, will be explained.

Figure 1:
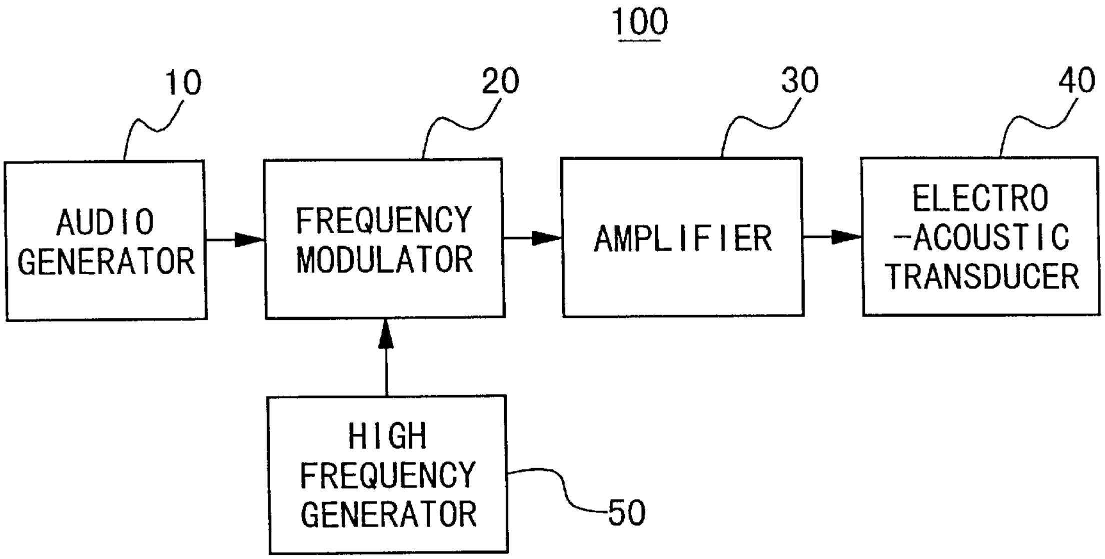
FIG. 1 is a block diagram showing an ultra-directional speaker according to an embodiment of the present invention.

FIG. 1 is a block diagram showing a construction of an ultra-directional speaker 100, which comprises an audio generator 10, an ultrasonic generator 50 for generating an ultrasonic signal at a high frequency, a frequency modulator 20 which is connected to the audio generator 10 and to the ultrasonic generator 50, and an electro-acoustic transducer 40 for transducing a modulated ultrasonic signal output from the frequency modulator 20 into acoustic waves.

The audio generator 10 generates an audio signal, while the ultrasonic generator 50 generates the ultrasonic signal.

The audio signal and the ultrasonic signal are supplied to the frequency modulator 20, which frequency modulates the ultrasonic signal with the audio signal to produce the frequency modulated ultrasonic signal. The electro-acoustic transducer 40, which receives the frequency modulated ultrasonic signal via an amplifier 30, transduces the frequency modulated ultrasonic signal into acoustic waves.

The audio generator 10 in the ultra-directional speaker 100 of the present invention is not limited to this embodiment, and may output audio signals from cassette tapes, magnetic discs, hard discs, and general radio, TV, and movies. The ultrasonic generator 50 may be any device which generates an ultrasonic signal in a high frequency band of 10 kHz to 1000 kHz, and preferably, several 10 kHz to several 100 kHz.

The amplifier 30 may be connected between the frequency modulator 20 and the electro-acoustic transducer 40 if desired or deemed necessary in a given application. Because in the present invention the high sound pressure is achieved using the frequency modulator, the amplifier 30 is not necessarily provided. Preferably, the amplifier is provided when a particular high sound pressure is desired.

The electro-acoustic transducer 40 in the present invention is not limited to the embodiment, and may be an electro-acoustic transducer using a ceramic piezo-electronic element. A plurality of electro-acoustic transducers 40 may be arrayed, and the number thereof can be adjusted depending on a desired sound pressure.

A plurality of the electro-acoustic transducers 40 may be arranged, and by modifying the arrangement, the sound pressure can be enhanced, and a sound generating position, which is a virtual sound source position, can be appropriately modified. A plurality of the electro-acoustic transducers 40 may be connected to the single frequency modulator 20. The speaker may include a plurality of the ultrasonic generators 50 and the frequency modulators 20, from which the electro-acoustic transducers may receive different frequency modulated signals obtained from carrier ultrasonic waves at different frequencies.

Briefly, the ultra-directional speaker 100 includes the frequency modulator 20 which modulates the high frequency signal with the audio signal, thereby making the sound pressure for a listener higher than that of the background art. The audio signal is generated by the audio generator 10, and the high frequency signal is generated by the ultrasonic generator 50, which is a high frequency signal generator. The frequency modulator 20 performs modulation with the audio signal and the high frequency signal, and the resulting signal is amplified by the amplifier 30, if necessary, and is emitted as acoustic waves from the electro-acoustic transducer 40.

The acoustic waves from the electro-acoustic transducer 40 include ultrasonic waves and audible audio waves. Ultra-directional sound, which has low frequency components audible to a listener, is demodulated from the acoustic waves due to non-linear interaction during propagating via air as ultrasonic waves.

The audio generator 10 generates the electric audio signal corresponding to sound audible to a listener, and may be, for example, a cassette tape recorder for converting sound information recorded on a cassette tape into an electric audio signal, or a personal computer for converting sound information recorded in a hard disc drive into an electric audio signal.

The ultrasonic generator 50 in the present invention generates the high frequency signal in an ultrasonic frequency band of, for example, 10 kHz to 1000 kHz, and preferably, several 10 kHz to several 100 kHz, and may be, for example, a clock oscillator circuit. The frequency modulator 20 receives the audio signal and the high frequency signal, and outputs the frequency modulated signal.

The frequency modulated wave signal is amplified to 20V or 40V by the amplifier 30 if necessary. When the voltage of the frequency modulated wave signal is high, the amplifier can be omitted. The amplified frequency modulated signal is transduced into the acoustic waves by the electro-acoustic transducer 40 and is emitted via air. The ultra-directional sound, which has low frequency components audible to a listener, is demodulated from the acoustic waves due to non-linear interaction while propagating through the air as ultrasonic waves.

Figure 2:
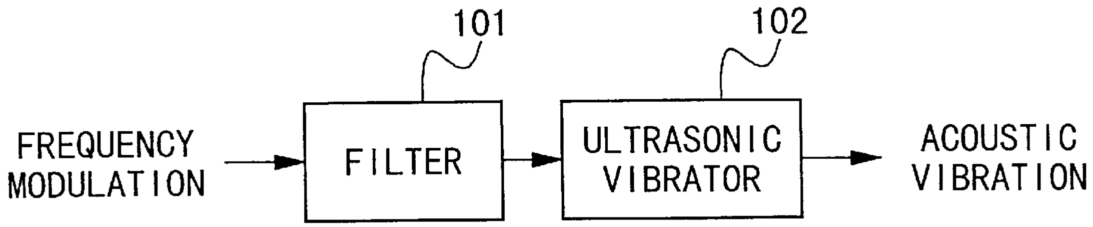
FIG. 2 is a block diagram showing an electro-acoustic transducer in the ultra-directional speaker of the present invention.

FIG. 2 is a block diagram showing a construction of the electro-acoustic transducer 40 in the present invention, in which the frequency modulated wave signal input to the electro-acoustic transducer 40 is transmitted through a selective filter 101 and is transduced into the acoustic waves by an ultrasonic vibrator 102. The filter 101 and the ultrasonic vibrator 102 may be integrated in a manner such that the electroacoustic transducer 40 may include an ultrasonic vibrator which exclusively emits ultrasonic waves in a frequency band of 90 kHz to 110 kHz.

Briefly, the frequency modulated signal is transmitted through the filter 101 and is converted into the acoustic waves by the ultrasonic vibrator 102. The filter 101 allows waves in a particular frequency band to be transmitted. When the filter 101 transmits waves in a band of 10% above and below 100 kHz, the ultrasonic vibrator 102 emits the acoustic waves in a frequency band of 90 kHz to 110 kHz.

While in FIG. 2 the filter 101 and the ultrasonic vibrator 102 are separated, they may be integrated in a manner such that, for example, the electro-acoustic transducer 40 may include an ultrasonic vibrator which emits only ultrasonic waves of 90 kHz to 110 kHz. That is, the waves transmitted through the ultrasonic vibrator 102 may be in any ultrasonic frequency band above 20 kHz. By using a comparatively low ultrasonic band around 40 kHz, a listener can sense sound with a higher sound pressure.

Alternatively, by using waves in a comparatively high ultrasonic band of 100 kHz to 300 kHz, sound having higher directionality can be provided to a listener. When the frequency of the ultrasonic waves is too high, the decay ratio increases so that the sound does not propagate to a significant distance. When the frequency of the ultrasonic waves is too low, convergence of the ultrasonic becomes worse, and thereby the tone quality is degraded. Therefore, the ultrasonic waves are set in a frequency band of 10 kHz to 1000 kHz, and preferably, several 10 kHz to several 100 kHz.

Figure 3:
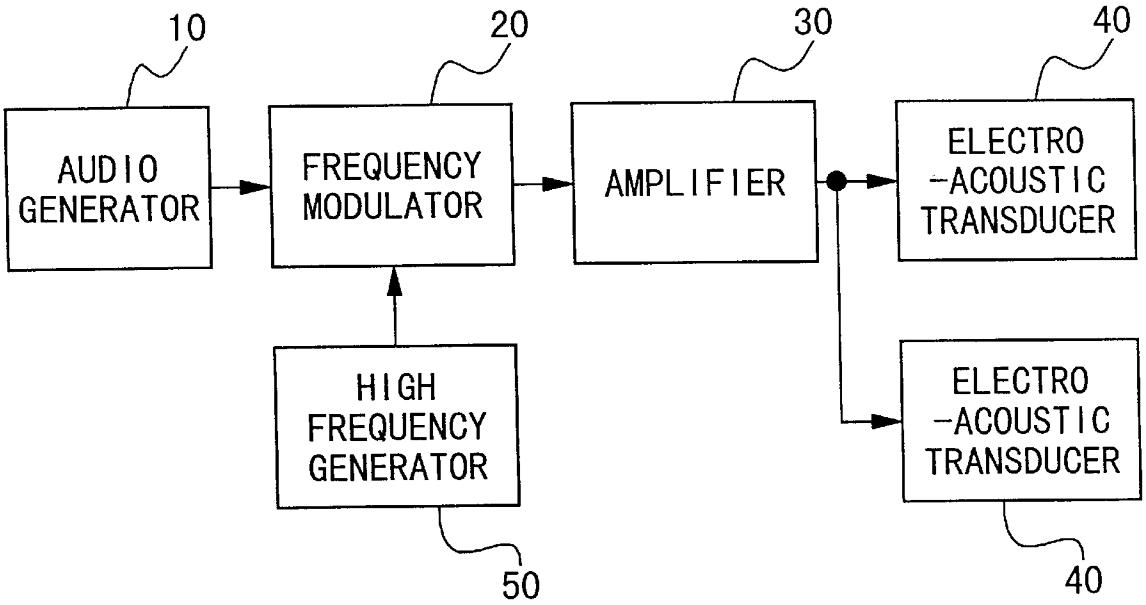
FIG. 3 is a block diagram showing an ultra-directional speaker according to another embodiment of the present invention.
Figure 4:
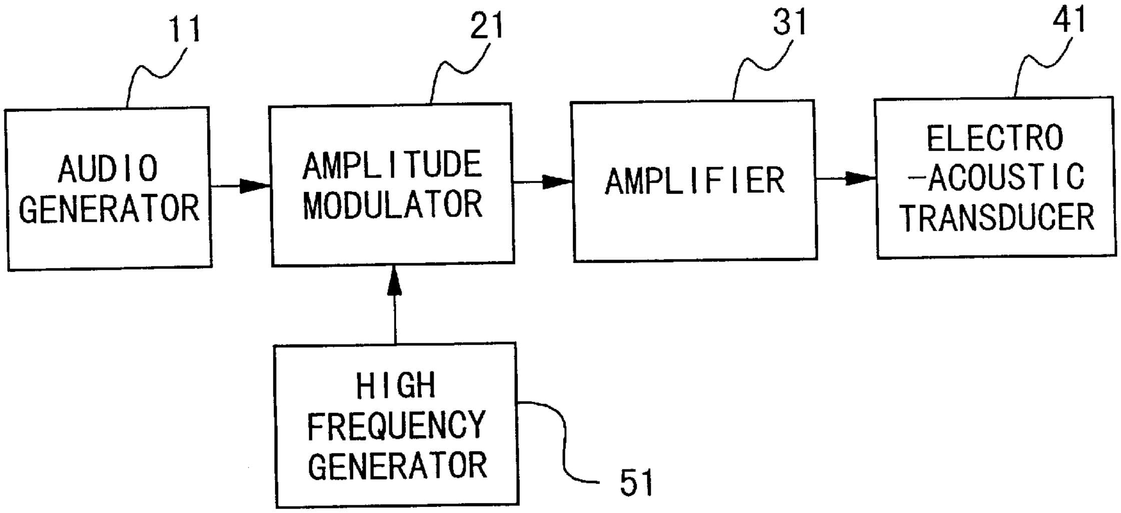
FIG. 4 is a block diagram showing an ultra-directional speaker of the background art.

Another embodiment according to the present invention will be explained in reference to FIG. 3. The embodiment in FIG. 3 includes two electro-acoustic transducers 40. An audio signal is generated by an audio generator 10, and a high frequency signal is generated by a high frequency signal generator 50. A frequency modulator 20 performs frequency modulation with the audio signal and the high frequency signal, and a resulting signal is amplified by an amplifier 30 and is emitted as acoustic waves by the two electro-acoustic transducers 40.

By emitting through the two electro-acoustic transducers 40, the sound pressure with which the acoustic waves are sensed by a listener is increased by 6 dB, as compared that with the single electro-acoustic transducer 40. Three or more electro-acoustic transducers 40 may be employed to provide the acoustic waves with the high sound pressure to a listener.

Various well-known techniques may be added to the present invention, and for example, a virtual sound source means by sound reflection to allow the sound waves to converge in the air, an ultrasonic filter for eliminating harmful effects to the auditory sense of a listener, or a means for switching sound input signals based on determination of presence or absence of waves reflected from a listener can be added to the present invention while achieving the advantageous effects.

Preferably, the ultra-directional speaker 100 according to the present invention includes a reflection board for reflecting the ultrasonic waves and the audible acoustic waves from the electro-acoustic transducer 40. The reflection board is positioned close to the electro-acoustic transducer 40 and preferably has a curved reflection surface.

According to the above construction, the ultrasonic waves and the audible sound waves from the electro-acoustic transducer 40 may converge on a specified point, thereby providing a virtual sound source effect.

The ultra-directional speaker 100 may include a filter for selectively absorbing the ultrasonic waves. For example, from the ultrasonic waves and the audible sound waves emitted from the electro-acoustic transducer 40, the filter exclusively absorbs the ultrasonic waves, allowing the sound to be transmitted.

As is obvious from the above description, the speaker includes the electroacoustic transducer for outputting directional sound waves using ultrasonic carrier waves. In a method of the present invention, the speaker is driven by the frequency modulated signal obtained by the frequency modulation with the ultrasonic signal and the audio signal.

In the method for driving the speaker, the ultrasonic waves in a frequency band of 10 kHz to 1000 kHz, and preferably, several 10 kHz to several 100 kHz, are used. A plurality of the electro-acoustic transducers 40 may be driven by the single frequency modulator 20, or by a plurality of the ultrasonic generators 50 and the frequency modulators 20 connected to the electro-acoustic transducers 40.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An ultra directional speaker comprising:

an audio generator which generates an audio signal;

ultrasonic generators which generate ultrasonic signals of different frequencies;

frequency modulators which frequency modulate said ultrasonic signals with said audio signal to produce frequency modulated ultrasonic signals; and a plurality of electro-acoustic transducers, which receives different frequency modulated ultrasonic signals respectively and transduce said frequency modulated ultrasonic signals to emit ultrasonic waves in a predetermined frequency band included in said frequency modulated ultrasonic signals, wherein said electro-acoustic transducers are driven by said frequency modulators connected to said ultrasonic generators respectively.

2. An ultra-directional speaker according to claim 1, further comprising amplifiers for amplifying said frequency signals, said amplifiers being connected between said frequency modulators and said electro-acoustic transducers.

3. An ultra-directional speaker according to claim 1, wherein said ultrasonic generators generate said ultrasonic signals in a frequency range of 20 kHz to 1000 kHz.

4. An ultra-directional speaker according to claim 1, further comprising a reflection plate that generates a virtual sound source effect by reflecting the ultrasonic waves and audible sound waves included in acoustic waves from said elector-acoustic transducers, and converging said ultrasonic waves and said audible sound waves at a specific point.

5. An ultra-directional speaker according to claim 4, wherein said reflection plate has a curved reflection surface.

6. An ultra-directional speaker according to claim 1, further comprising a filter for selectively absorbing said ultrasonic waves.

7. An ultra-directional speaker according to claim 1, wherein said ultrasonic generators generate said ultrasonic signals in a predetermined frequency band.

8. An ultra-directional speaker according to claim 7, wherein the predetermined frequency band is in the ultrasonic wave band of approximately 40 kHz.

9. An ultra-directional speaker according to claim 7, wherein the predetermined frequency band is in the ultrasonic wave band from 100 kHz to 300 kHz.

10. An ultra-directional speaker according to claim 7, wherein said ultrasonic generators generate aid ultrasonic signals exclusively in said predetermined frequency band.

11. An ultra-directional speaker according to claim 7, wherein said predetermined frequency band is between 20 kHz and 1000 kHz.

12. An ultra-directional speaker according to claim 7, wherein said predetermined frequency band is between 90 kHz and 110 kHz.

13. An ultra-directional speaker according to claim 1, wherein each of said electro-acoustic transducer include:

a selective filter which passes only a portion of each of said frequency modulated ultrasonic signal which lies within a predetermined frequency band; and an ultrasonic vibrator for converting said filtered frequency modulated ultrasonic signal into acoustic waves.

14. An ultra-directional speaker according to claim 13, wherein said predetermined frequency band corresponds to frequencies at or above 20 kHz.

15. A method for driving a speaker which includes a plurality of electro-acoustic transducers for outputting ultra-directional acoustic waves of different frequencies from an audlo signal using ultrasonic carrier waves, comprising the steps of:

frequency modulating said ultrasonic carrier waves of different frequencies with said audio signal to produce frequency modulated ultrasonic signals;

driving said electro-acoustic transducers with said frequency modulated signals having different frequencies, and emitting acoustic waves of a specified frequency band included in said frequency modulated signals, wherein said electro-acoustic transducers are driven by a plurality of different frequencies modulators connected to a plurality of ultrasonic generators, respectively.

16. A method according to claim 15, wherein said ultrasonic carrier waves have a frequency range of 20 kHz to 100 kHz.

17. A method of claim 15, wherein said specified frequency band is in the ultrasonic wave band at approximately 40 kHz.

18. A method of claim 15, wherein said specified frequency band is in the ultrasonic wave band from 100 kHz to 300 kHz.

19. A method of claim 15, wherein said specified frequency band is between 20 kHz and 1000 kHz.

20. A method of claim 15, wherein said specified frequency band is between 90 kHz and 110 kHz.

21. A method for driving a speaker which includes a plurality of electro-acoustic transducers, for outputting ultra-directional acoustic waves from an audio-signal using ultrasonic carrier waves of different frequencies, comprising the steps of:

frequency modulating said ultrasonic carrier waves of different frequencies with said audio signal to produce frequency modulated signals having different frequencies;

driving said plurality of electro-acoustic transducers with said frequency modulated signals; and emitting acoustic waves in specified frequency bands included in said frequency modulated signal in order to enhance a sound pressure to a listener.

* * * * *